United States Patent [19]
Park

[11] Patent Number: 5,583,823
[45] Date of Patent: Dec. 10, 1996

[54] DRAM REFRESH CIRCUIT

[75] Inventor: Jong S. Park, Kyungki-do, Rep. of Korea

[73] Assignee: LG Semicon Co., Ltd., Chungcheongbuk-do, Rep. of Korea

[21] Appl. No.: 566,408

[22] Filed: Dec. 1, 1995

[30] Foreign Application Priority Data

Dec. 1, 1994 [KR] Rep. of Korea .................. 32372/1994

[51] Int. Cl.$^6$ .................................. G11C 7/00; G11C 8/00
[52] U.S. Cl. .............. 365/230.03; 365/236; 365/189.07; 365/193; 365/222
[58] Field of Search ............................. 365/230.03, 236, 365/189.07, 193, 222

[56] References Cited

U.S. PATENT DOCUMENTS

| | | | |
|---|---|---|---|
| 4,991,112 | 2/1991 | Callemyn | 364/518 |
| 5,208,782 | 5/1993 | Sakuta et al. | 365/230.03 |
| 5,502,677 | 3/1996 | Takahashi | 365/222 |

*Primary Examiner*—David C. Nelms
*Assistant Examiner*—Trong Phan
*Attorney, Agent, or Firm*—Finnegan, Henderson, Farabow, Garrett & Dunner, L.L.P.

[57] ABSTRACT

A DRAM refresh circuit includes control logic for selectively placing the DRAM in normal modes of operation. An X register stores and outputs the capacity value of a DRAM, and a timer receives the output value of a timer register and a timer clock, and counts a refresh operation time. A refresh counter receives the output of a refresh counter register and a refresh counter clock, and counts the refresh operations. A comparator compares the output signals of the refresh counter, timer, and X register, and outputs a refresh enable signal in response to these signals. A priority circuit receives the output signals of the control logic and comparator and generates signals corresponding to the normal modes of operation and the refresh mode. A memory control signal generator is also provided for generating RAS1 and CAS1 signals and the refresh counter clock in accordance with the output from priority circuit.

4 Claims, 2 Drawing Sheets

DRAM REFRESH CIRCUIT

BACKGROUND OF THE INVENTION

The present invention relates to a DRAM (dynamic random access memory) refresh circuit, and more particularly, to a DRAM refresh circuit suitable for improving memory access characteristics by efficiently performing the DRAM's memory access and refresh operations in a DRAM controller.

Generally, a DRAM is manufactured by using MOS technology, and includes memory cells having a large capacitance, low power consumption, but limited operation speed.

An SRAM, on the other hand, has a fast information processing speed and does not need refresh. The SRAM, however, is more expensive than the DRAM, and, therefore, DRAMs are more widely used than SRAMs.

Unlike the SRAM in which information is stored in a flipflop, the DRAM memory cell capacitor stores an amount of charge indicative of a "1" or a "0." After a given amount of time, however, this charge can leak away, thereby, erasing information stored in the DRAM cell. Accordingly, the DRAM's memory cells must be periodically recharged or refreshed at least every 2–10 ns, otherwise, data is lost.

A conventional DRAM refresh circuit will now be described with reference to FIGS. 1 and 2, which illustrate a block diagram of a conventional DRAM refresh circuit (FIG. 1), and timing diagram (FIG. 2) relative to the circuit shown in FIG. 1.

The DRAM refresh circuit includes a memory read controller 1 for receiving the CPU's program control signal and controlling the DRAM's read operation. A memory write controller 2 and refresh controller 3 are also coupled to the CPU for controlling the DRAM's write and refresh operations, respectively. OR gate 4 performs a logical operation on the output signals of memory read controller 1 and memory write controller 2 to output a write/read normal mode enable signal. Lastly, a memory control signal generator 5 receives the output signal from OR gate 4 and the refresh enable signal from refresh controller 3 and outputs RASI (row address strobe) and CASI (column address strobe) signals in response thereto.

FIG. 2 is a DRAM-refresh mode timing diagram illustrating operation of the circuit shown in FIG. 1. In FIG. 2, the operation time is divided into frames, each of which includes a plurality of slots. A single predetermined slot in each frame is designated for the refresh mode.

In order to write data into the DRAM, the DRAM is placed in a write operation mode. In which case, the CPU transmits a write signal to memory write controller 2, which supplies the write signal to control signal generator 5 via OR gate 4. Memory control signal generator 5, in turn, produces normal mode RASI and CASI signals.

After the data write, the CPU performs the refresh operation in order to prevent data loss in the DRAM. In order to read data into the controller 3, proper data must be accessed. Here, the CPU must appropriately allocate time to read data and time to refresh. As shown in FIG. 2, during the period from the first slot to the second to last slot in each frame, the CPU uses memory read controller 1 to produce the RASI and CASI signals in order to read data in the normal mode. In the last slot of each frame, the CPU uses refresh controller 3 to produce the refresh enable signal, in response to which control signal generator 5 outputs a CASI signal before a RASI signal.

In the conventional DRAM refresh circuit, the CPU must allot both the memory access and refresh functions. For this reason, data is not read during the refresh mode. Accordingly, data processing is not efficiently performed when a significant amount of data must be processed.

SUMMARY OF THE INVENTION

Therefore, it is an object of the present invention to provide a DRAM refresh circuit which preferably uses a single register to perform an automatic refresh, thereby, improving memory access characteristics.

To accomplish the object of the present invention, there is provided a DRAM refresh circuit comprising: a control logic for selectively controlling a normal mode operation; an X register for storing and outputting the capacity of a DRAM; a timer for receiving the output value of the timer register and a timer clock and for counting a refresh operation time; a refresh counter for receiving the output of the refresh counter register and a refresh counter clock and for counting the refresh operations; a comparator for comparing the output signals of the refresh counter, the timer and the X register and outputting a refresh enable signal; a priority circuit for receiving the output signals of the control logic and comparator to determine the normal mode and refresh mode; and a memory control signal generator for generating RASI and CASI signals and the refresh counter clock according to the priority circuit's selection.

DETAILED DESCRIPTION OF THE PREFERRED EMBODIMENTS

An exemplary embodiment of the present invention will now be described with reference to FIG. 3.

Figure 1:
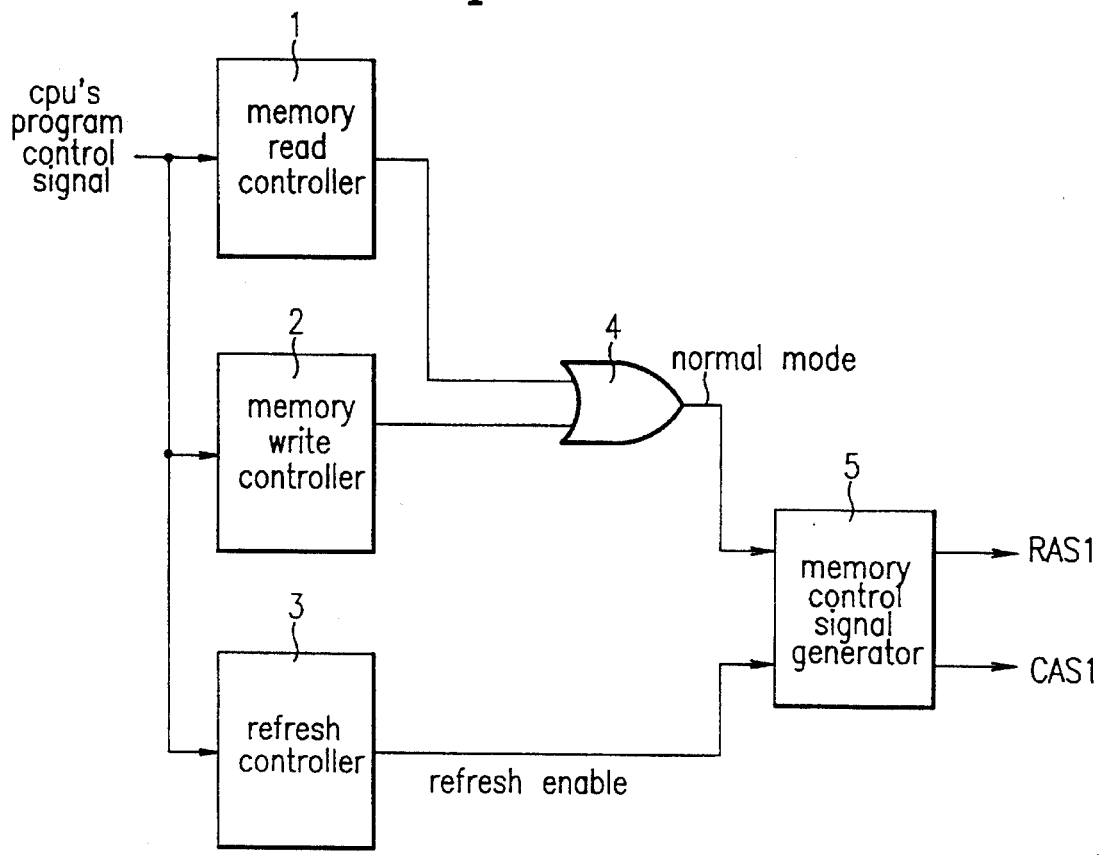
FIG. 1 is a block diagram of a conventional refresh circuit.
Figure 2:
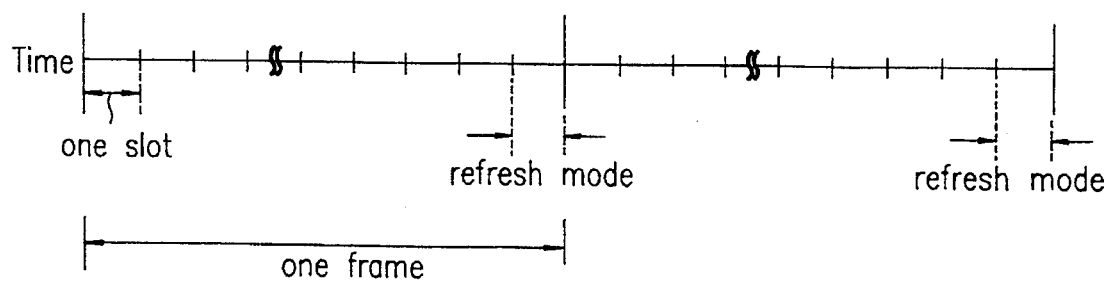
FIG. 2 is a timing diagram illustrating the operation of the conventional refresh circuit shown in FIG. 1.
Figure 3:
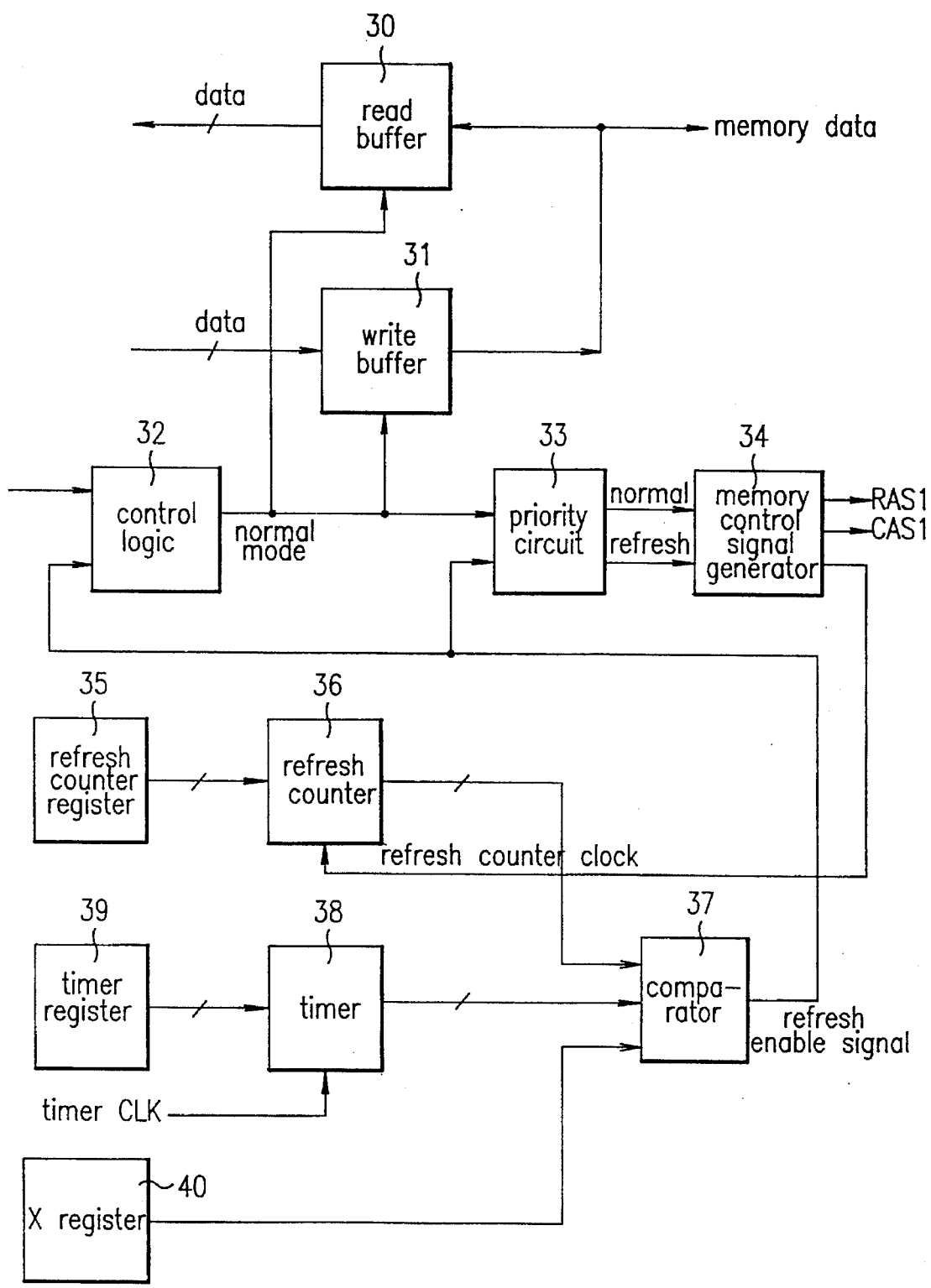
FIG. 3 is a block diagram of the embodiment of a DRAM refresh circuit of the present invention.

As shown in FIG. 3, the refresh circuit in accordance with the present invention preferably includes control logic 32 for receiving the CPU's program control signal and selectively controlling the write/read operation during the normal modes of operation. Write buffer 31 is used during the memory write operation mode in response to an appropriate control signal received from control logic 32, and a read buffer 30 is used during the memory read operation mode. Timer register 39 stores and outputs a refresh time value of the particular DRAM coupled to the CPU, and X register 40 stores a capacity value associated with the DRAM. For example, for a 4 mega-bit DRAM the capacity or number for refresh stored in X register 40 is 1000 times. For a 16 mega-bit DRAM, the capacity value stored in X register 40 is 4000 times.

Refresh counter register 35 stores and outputs a counter value for a corresponding refresh operation, and timer 38 receives the output value of timer register 39 and a timer clock CLK. In response to these signals, refresh counter register 35 counts the refresh operation time.

The DRAM refresh circuit of the present invention further includes a refresh counter 36 that receives the output of refresh counter register 35 and a refresh counter clock and, in response thereto, counts the number of refresh operations.

A comparator 37 compares the output signals of refresh counter 36, timer 38 and X register 40 and outputs a refresh enable signal. A priority circuit 33 receives the output signals of control logic 32 and comparator 37 and determines whether the DRAM should be placed in a normal mode or refresh mode, and a memory control signal generator 34 is further provided for generating RASI and CASI signals and the refresh counter clock in accordance with the output of priority circuit 33.

Further, in the DRAM refresh circuit of the present invention, control logic 32 receives the refresh enable signal of comparator 37, and refresh counter 36 receives the refresh counter clock, which is the output of memory control signal generator 34.

The operation of the DRAM refresh circuit of the present invention will now be described in greater detail below.

First, the CPU controls write buffer 31 via control logic 32 so that data is written in the normal operation mode. After a data write, in order to perform data write and refresh operations at the same time, the size of a corresponding DRAM is stored in a register table in X register 40 prior to this operation mode.

Here, the value of timer register 39 is transmitted to timer 38 so that the timer clock counts continuously. When the value counted by timer 38 becomes equal to the value of timer register 39, the timer restarts its counting.

During the refresh mode, the refresh counter 36 increments its count value and applies the incremented count value to comparator 37. X register 40 also outputs to comparator 37 the capacity value stored in accordance with the number of times refresh execution is required. Thus, comparator 37 compares the value provided from refresh counter 36 with that from X register 40 and then outputs a refresh enable signal. In particular, comparator 37 is in a refresh operation enable state when the value of the timer is greater than the sum of the refresh counter value and the X register value. At this time, the refresh enable signal is outputted from comparator 37 only when the count value of timer 38 is applied to comparator 37

After some time has elapsed, timer 38 continues to operate and refresh counter 36 performs the refresh mode. As a result, comparator 37 outputs the refresh enable signal, which is input to priority circuit 33 to stop a normal mode data read, thereby, placing the memory in the refresh mode.

After receiving the refresh enable signal, memory signal generator 34 produces RASI and CASI signals and outputs the refresh counter clock. The refresh counter clock is input to refresh counter 36 to initiate its operation.

During the refresh mode, if the CPU does not request a DRAM data read, the refresh mode is maintained. If the CPU requests a DRAM data read, the mode is changed to the normal read mode by control logic 32 under control of the CPU. At this time, priority circuit 33 outputs two enable signals, a normal enable signal and an appropriate refresh enable signal. Here, in the normal read mode, memory control signal generator 34 produces RASI and CASI signals. The refresh counter clock, however, is not produced, and refresh counter 36 does not operate.

As described above, the DRAM refresh circuit of the present invention does not require the CPU to separately allot the memory access and refresh modes. Therefore, the present invention overcomes the conventional drawback in which data is not read during refresh. Advantageously, the invention only requires that the size of the DRAM is stored, preferably in a register, and refresh is performed automatically when the DRAM access operation is not performed. The refresh circuit in accordance with present invention improves efficiency of the DRAM, particularly, when a large amount of data must be processed.

What is claimed is:

1. A refresh circuit for a DRAM comprising:

a control logic generating a signal for selectively controlling normal modes of operation of said DRAM;

an X register for storing and outputting a capacity value of said DRAM;

a timer register for storing a time value;

a timer clock generating a first clock signal;

a timer coupled to said timer register and said timer clock, said timer counting a refresh operation time of said DRAM in response to said time value and said first clock signal;

a refresh counter register generating an output signal;

a refresh counter clock generating a second clock signal;

a refresh counter coupled to said refresh counter and said refresh counter register, said refresh counter generating a refresh operation count in response to said output signal and said second clock signal;

a comparator coupled to said refresh counter, said timer and said X register, and outputting a refresh enable signal on the basis of a comparison of said capacity value of said DRAM, said counting refresh operation time and said refresh operation count;

a priority circuit receiving said refresh enable signal from said comparator and said signal from said control logic and, in response thereto, outputting a priority signal corresponding to said normal modes of operation or a refresh mode operation of said DRAM; and a memory control signal generator for generating RASI and CASI signals and said refresh counter clock signal in accordance with said priority signal.

2. A DRAM refresh circuit in accordance with claim 1, wherein said refresh counter receives said second clock signal from said memory control signal generator.

3. A DRAM refresh circuit in accordance with claim 1, wherein said control logic receives said refresh enable signal.

4. A DRAM refresh circuit in accordance with claim 1, wherein said comparator outputs the refresh enable signal when a value of said refresh operation time of said DRAM, as counted by said timer, is greater than a sum of said capacity value of said DRAM and said refresh operation count.

* * * * *

UNITED STATES PATENT AND TRADEMARK OFFICE
CERTIFICATE OF CORRECTION

PATENT NO. : 5,583,823  Page 1 of 3
DATED : December 10, 1996
INVENTOR(S) : Jong Suk PARK It is certified that error appears in the above-indentified patent and that said Letters Patent is hereby corrected as shown below:

Title page, item [57], in the Abstract, line 14, "RASI and CASI" should read --RAS1 and CAS1--.

column 1, line 42, "RASI" should read --RAS1-- and "CASI" should read --CAS1--.

column 1, line 55, "RASI and CASI" should read --RAS1 and CAS1--.

column 1, line 62, "RASI" should read --RAS1--.

column 1, line 63, "CASI" should read --CAS1--.

column 1, line 66, "CASI" should read --CAS1--.

column 1, line 67, "RASI" should read --RAS1--.

UNITED STATES PATENT AND TRADEMARK OFFICE
CERTIFICATE OF CORRECTION

PATENT NO. : 5,583,823
DATED : December 10, 1996
INVENTOR(S) : Jong Suk PARK

It is certified that error appears in the above-indentified patent and that said Letters Patent is hereby corrected as shown below:

column 2, line 27, "RASI and CASI" should read --RAS1 and CAS1--.

column 3, line 7, "RASI and CASI" should read --RAS1 and CAS1--.

column 3, line 47, "RASI and CASI" should read --RAS1 and CAS1--.

column 3, line 57, "RASI and CASI" should read --RAS1 and CAS1--.

Claim 1, column 4, line 43, "RASI" should read --RAS1--.

UNITED STATES PATENT AND TRADEMARK OFFICE
CERTIFICATE OF CORRECTION

PATENT NO.    : 5,583,823
DATED         : December 10, 1996
INVENTOR(S)   : Jong Suk PARK It is certified that error appears in the above-indentified patent and that said Letters Patent is hereby corrected as shown below:

Claim 1, column 4, line 44, "CASI" should read --CAS1--.

Signed and Sealed this

Twenty-fourth Day of June, 1997

Attest:

BRUCE LEHMAN

Attesting Officer    Commissioner of Patents and Trademarks